(12) United States Patent
Lu

(10) Patent No.: US 10,090,864 B2
(45) Date of Patent: Oct. 2, 2018

(54) SYSTEM AND METHOD FOR DECODING VARIABLE LENGTH CODES

(71) Applicant: SAMSUNG DISPLAY CO., LTD., Yongin, Gyeonggi-Do (KR)

(72) Inventor: Ning Lu, Saratoga, CA (US)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/836,900

(22) Filed: Aug. 26, 2015

(65) Prior Publication Data

US 2016/0087651 A1    Mar. 24, 2016

Related U.S. Application Data

(60) Provisional application No. 62/053,708, filed on Sep. 22, 2014.

(51) Int. Cl.
*H03M 13/39* (2006.01)
*H03M 7/40* (2006.01)
*H03M 7/30* (2006.01)

(52) U.S. Cl.
CPC ......... *H03M 13/3905* (2013.01); *H03M 7/40* (2013.01); *H03M 7/6005* (2013.01); *H03M 13/3994* (2013.01); *H03M 13/42* (2013.01)

(58) Field of Classification Search
CPC ......... H03M 13/3905; H03M 13/3994; H03M 13/42
See application file for complete search history.

(56) References Cited

U.S. PATENT DOCUMENTS

| | | | | |
|---|---|---|---|---|
| 5,594,742 | A | * | 1/1997 | Hemmati ............ H03M 13/251 714/761 |
| 6,877,132 | B1 | * | 4/2005 | De ....................... H03M 13/23 714/795 |
| 2007/0140149 | A1 | * | 6/2007 | Gandham ........... H04L 12/2602 370/255 |
| 2007/0290899 | A1 | | 12/2007 | Monro |
| 2010/0088687 | A1 | | 4/2010 | Choi et al. |
| 2010/0141489 | A1 | | 6/2010 | Reznik |

* cited by examiner

*Primary Examiner* — Joseph D Torres
(74) *Attorney, Agent, or Firm* — Lewis Roca Rothgerber Christie LLP

(57) ABSTRACT

A method for decoding a variable length coded input including a plurality of binary code symbols into an output symbol includes: setting, by a decoder including a processor and memory storing a lookup table including a plurality of states, a current state to an initial state and a current branch length to an initial branch length; and identifying, by the decoder using the lookup table, a next state or a symbol of the output symbols based on a current state, a current branch length, and a next binary code symbol of the variable length coded input.

7 Claims, 7 Drawing Sheets

SYSTEM AND METHOD FOR DECODING VARIABLE LENGTH CODES

CROSS-REFERENCE TO RELATED APPLICATION(S)

This application claims priority to and the benefit of U.S. Provisional Patent Application No. 62/053,708, titled "A Compact Design to Decode Optimized Variable Length Codebook" filed in the United States Patent and Trademark Office on Sep. 22, 2014, the entire disclosure of which is incorporated herein by reference.

BACKGROUND

1. Field

Aspects of embodiments of the present invention relate to system and methods for encoding and decoding variable length codes.

2. Related Art

A variable length codebook (or variable length encoding) provides a mapping between symbols and a variable number of bits. Variable length codebooks allow compression of data having skewed distributions by using fewer bits for symbols that appear more frequently under typical conditions and, as a tradeoff, using more bits for symbols that appear less frequently. For example, in the English language, the letter "E" appears more frequently than the letter "J" and therefore a variable length code for encoding English text would use fewer bits in the encoding of the letter "E" than in the encoding of the letter "J."

SUMMARY

Aspects of embodiments of the present invention are directed to systems and methods for decoding a variable length code using simplified hardware.

According to one embodiment of the present invention, a method for decoding a variable length coded input including a plurality of binary code symbols into an output symbol includes: setting, by a decoder including a processor and memory storing a lookup table including a plurality of states, a current state to an initial state and a current branch length to an initial branch length; and identifying, by the decoder using the lookup table, a next state or a symbol of the output symbols based on a current state, a current branch length, and a next binary code symbol of the variable length coded input.

The method may further include: when the next state is identified, updating, by the decoder, the current state to the next state; updating, by the decoder, the current branch length; updating, by the decoder, the next binary code symbol of the variable length coded input; and repeating, by the decoder, the identifying the next state or the symbol of the output symbols based on the updated current state, the updated current branch length, and the updated next binary code symbol of the variable length coded input; and when the symbol of the output symbols is identified, outputting, from the decoder, the symbol of the output symbols.

The identifying the next state or the symbol may include: identifying a matching entry in a lookup table representing a codebook, the codebook mapping a plurality of sequences of binary code symbols to a plurality of output symbols, the binary code symbols including a first code symbol and a second code symbol, wherein the codebook has a binary tree representation including a plurality of branches, the branches including a plurality of internal nodes, a plurality of leaf nodes, and a plurality of edges between the nodes, each edge being associated with one of the first code symbol and the second code symbol, wherein each of the internal nodes is associated with a first edge associated with the first code symbol and connected to a first branch and a second edge associated with the second code symbol and connected to a second branch, and wherein a branch length of the first branch is longer than a branch length of second branch.

The identifying the next state or the symbol may include: identifying a formula corresponding to the current state; and identifying the symbol of the output symbols based on the formula corresponding to the current state, the current branch length, and the next binary code symbol.

The processor may implements a common module used for each of the plurality of states.

The variable length coded input may be run-length encoded data and the output symbols may be pairs of zero runs and magnitude.

The method may further include receiving the variable length coded input from a serial link.

The lookup table may include a plurality of lookup tables mapping branch length and binary coded symbol to the next state or the symbol of the output symbols, each of the lookup tables corresponding to a different state of the plurality of states.

According to one embodiment of the present invention, a method for modifying a codebook for implementation on a hardware decoder, the codebook having a binary tree representation including a plurality of branches, the branches comprising a plurality of internal nodes, a plurality of leaf nodes, and a plurality of edges between the nodes, each edge being associated with one of a first code symbol and a second code symbol; each branch including at least one leaf node, includes, for each internal node in the binary tree: identifying, by a processor, a first branch connected to the internal node by a first edge of the plurality of edges and a second branch connected to the internal node by a second edge of the plurality of edges, the first edge being associated with the first code symbol and the second edge being associated with the second code symbol; determining, by the processor, a length of the first branch; determining, by the processor, a length of the second branch; when the length of the first branch is greater than the length of the second branch, assigning, by the processor, the first branch to the first edge associated with the first code symbol and assigning the second branch to the second edge associated with the second code symbol; when the length of the second branch is greater than the length of the first branch, assigning, by the processor, the second branch to the first edge associated with the first code symbol and assigning the first branch to the second edge associated with the second code symbol; and outputting, by the processor, a modified codebook.

The determining the length of the first branch includes determining, by the processor, a maximum number of internal nodes between the current node and a leaf node of the first branch, and wherein the determining the length of the second branch includes determining, by the processor, a maximum number of internal nodes between the current node and a leaf node of the second branch.

A system for decoding a variable length coded input including a plurality of binary code symbols into one or more output symbols includes: a processor and memory, the memory storing: a lookup table mapping a state, a next binary code symbol of the variable length coded input, and a branch length to a next state or an output symbol of the one or more output symbols; and instructions that, when executed by the processor, cause the processor to: set a current state to an initial state and a current branch length to an initial branch length; receive a binary code symbol of the binary code symbols; and identify a next state or an output symbol using the lookup table based on a current state, the binary code symbol, and a current branch length.

The memory may further store instructions that, when executed by the processor, cause the processor to: when the next state is identified: update the current state based on the next state; and update the current branch length; and repeat the identifying the next state or the output symbol; and when the output symbol is identified: output the output symbol.

The memory may further store instructions that, when executed by the processor, cause the processor to: identify a matching entry in a lookup table representing a codebook, the codebook mapping a plurality of sequences of binary code symbols to a plurality of output symbols, the binary code symbols comprising a first code symbol and a second code symbol, wherein the codebook has a binary tree representation comprising a plurality of branches, the branches comprising a plurality of internal nodes, a plurality of leaf nodes, and a plurality of edges between the nodes, each edge being associated with one of the first code symbol and the second code symbol, wherein each of the internal nodes is associated with a first edge associated with the first code symbol and connected to a first branch and a second edge associated with the second code symbol and connected to a second branch, and wherein a branch length of the first branch is longer than a branch length of second branch.

The memory may further store instructions that, when executed by the processor, cause the processor to identify the next state or symbol by: identifying a formula corresponding to the current state; and identifying the symbol of the output symbols based on the formula corresponding to the current state, the current branch length, and the next binary code symbol.

The memory may further store instructions that, when executed by the processor, cause the processor to implement a common module used for each of the plurality of states.

The variable length coded input may be run-length encoded data and the output symbols may be pairs of zero runs and magnitude.

The system may further include a serial link, wherein the processor receives the variable length coded input from the serial link.

The lookup table may include a plurality of lookup tables mapping branch length and binary coded symbol to the next state or the symbol of the output symbols, each of the lookup tables corresponding to a different state of the plurality of states.

According to one embodiment of the present invention, a system for modifying a codebook for implementation on a hardware decoder, includes: a processor and memory, the memory storing: the codebook, wherein the codebook has a binary tree representation comprising a plurality of branches, the branches including a plurality of internal nodes, a plurality of leaf nodes, and a plurality of edges between the nodes, each edge being associated with one of a first code symbol and a second code symbol; each branch including at least one leaf node; and instructions that, when executed by the processor, cause the processor to: identify a first branch connected to the internal node by a first edge of the plurality of edges and a second branch connected to the internal node by a second edge of the plurality of edges, the first edge being associated with the first code symbol and the second edge being associated with the second code symbol; determine a length of the first branch; determine a length of the second branch; when the length of the first branch is greater than the length of the second branch, assign the first branch to the first edge associated with the first code symbol and assign the second branch to the second edge associated with the second code symbol; when the length of the second branch is greater than the length of the first branch, assign the second branch to the first edge associated with the first code symbol and assign the first branch to the second edge associated with the second code symbol; and output a modified codebook.

The memory may further store instructions that, when executed by the processor, cause the processor to: determine a maximum number of internal nodes between the current node and a leaf node of the first branch when determining the length of the first branch; and determine a maximum number of internal nodes between the current node and a leaf node of the second branch when determining a length of the second branch.

BRIEF DESCRIPTION OF THE DRAWINGS

The accompanying drawings, together with the specification, illustrate example embodiments of the present invention, and, together with the description, serve to explain the principles of the present invention.

DETAILED DESCRIPTION

Figure 1:
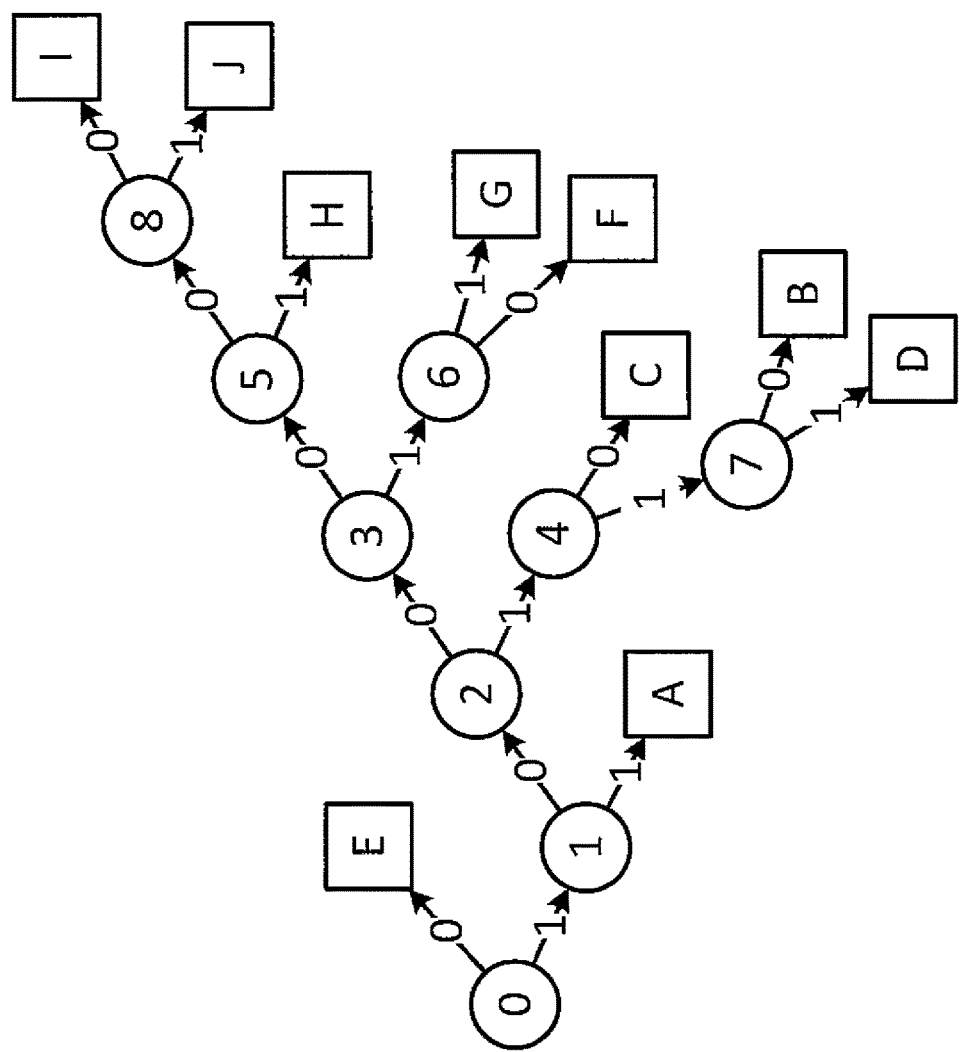
FIG. 1 is an illustration of a binary tree representing a codebook for decoding a variable length code.

In the following detailed description, only certain example embodiments of the present invention are shown and described, by way of illustration. As those skilled in the art would recognize, the invention may be embodied in many different forms and should not be construed as being limited to the embodiments set forth herein. Like reference numerals designate like elements throughout the specification.

One example of a variable length encoding is Huffman coding. The table that provides mappings between symbols and binary codes is called a codebook (or Huffman table). Table 1, below, is an example of a codebook mapping between the letters A through J and binary codes representing the letters:

TABLE 1

| Symbol | Code |
|---|---|
| A | 11 |
| B | 10110 |
| C | 1010 |
| D | 10111 |
| E | 0 |
| F | 10010 |
| G | 10011 |
| H | 10001 |
| I | 100000 |
| J | 100001 |

A codebook for a variable length encoding is considered valid when no code in the codebook is the prefix of any other code in the codebook. For example, a codebook that included codes "101" and "10100" would be invalid because the code "10100" starts with "101". This suggests that a codebook can also be expressed as a binary code tree (or state machine or finite automaton).

FIG. 1 is an example binary tree that represents the example codebook of Table 1, where internal nodes of the tree (depicted as numbered circles) indicate various states in the decoding of a code, the edges illustrate transitions to next states based on the next binary value of the variable length coded input (as such, each of the edges is associated with one of the binary code symbols, e.g., "0" or "1"), and leaf nodes (depicted with squares) of the tree indicate an end state corresponding to a decoded output symbol (e.g., in FIG. 1, one of the decoded symbols A through J). The nodes of the binary trees may be grouped into branches, where each internal node is connected to two branches via corresponding outgoing edges (in FIG. 1, edges with the arrows pointing away from the node) from the internal node. Each internal node, apart from the initial node (e.g., node 0 in FIG. 1), is also connected to one incoming edge (in FIG. 1, edges with the arrow pointing toward the node).

Table 2, below, is a lookup table that represents the codebook corresponding to the binary tree shown in FIG. 1, where the lookup table maps each of the states S and each possible input I ("0" or "1") in those states to the next state S to transition to and what symbol (O), if any, to output.

TABLE 2

| State (S) | I | O | Next S | I | O | Next S |
|---|---|---|---|---|---|---|
| 0 | 0 | E | 0 | 1 | | 1 |
| 1 | 0 | | 2 | 1 | A | 0 |
| 2 | 0 | | 3 | 1 | | 4 |
| 3 | 0 | | 5 | 1 | | 6 |
| 4 | 0 | C | 0 | 1 | | 7 |
| 5 | 0 | | 8 | 1 | H | 0 |
| 6 | 0 | F | 0 | 1 | G | 0 |
| 7 | 0 | B | 0 | 1 | D | 0 |
| 8 | 0 | I | 0 | 1 | J | 0 |

A hardware implementation of a decoder for decoding variable length codes may typically include a memory buffer to hold intermediate states in order to handle the variability of the undetermined code lengths from symbol to symbol. For example, Table 2 above shows nine different rows are used in the lookup table to represent the transitions between the various states of the diagram shown in FIG. 1.

As such, embodiments of the present invention are directed to systems and methods for decoding variable length codes, where computational requirements (e.g., memory and hardware components) for the decoding process are reduced. By designing the code table to have particular characteristics, aspects of embodiments of the present invention allows for a decoder having a reduced (or minimal) gate count while supporting very complex and/or large codebooks and while maintaining the same or substantially the same level of data compression. This allows an improvement over existing systems for decoding data by reducing the complexity of the underlying hardware, thereby reducing hardware costs Such a variable length encoding may be used over, for example, a data link between a graphical processing unit and a display panel in a computing device (e.g., a mobile phone, a tablet computer, a laptop computer, or a desktop computer), where the data link may be used to transmit graphics data (e.g., bitmapped images or video) from the graphical processing unit to the display panel. Data compression, such as Huffman coding, permits increased performance and higher resolution images to be transmitted to display panels, thereby allowing for improved sharpness of said panels, increased frame rates, and/or reduced power consumption (e.g., due to reduced symbol transmission rate to transmit the same data). Using an optimized codebook, such as in embodiments of the present invention, allows for further improvements in the transmission of data to the display panel.

Figure 2:
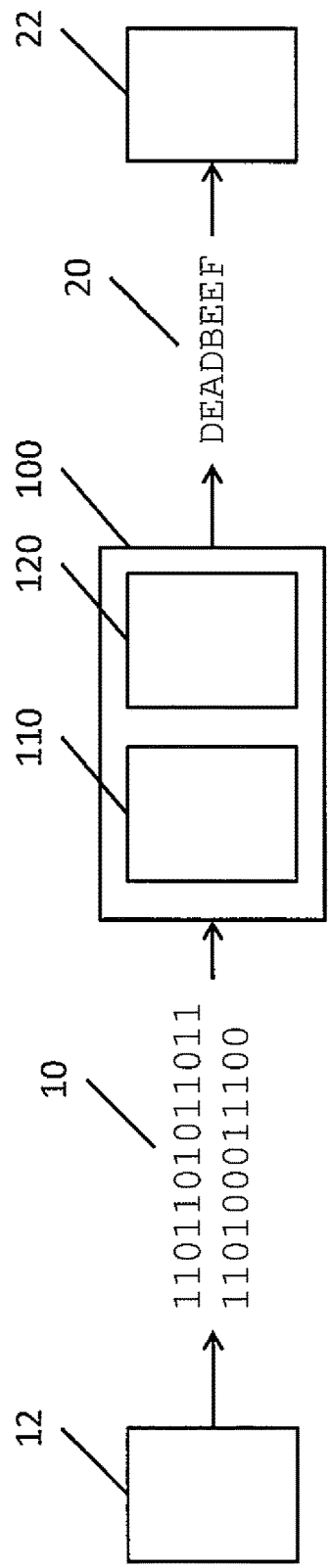
FIG. 2 is a block diagram illustrating a system according to one embodiment of the present invention for decoding a variable length coded input.

FIG. 2 is a block diagram illustrating a system according to one embodiment of the present invention for decoding a variable length coded input 10 received from an input port 12 (coupled, e.g., to a graphics processing unit) into a plurality of output symbols 20 supplied to an output port 22 (coupled, e.g., to a display panel). According to various embodiments of the present invention, a decoding system (or variable length decoder or Huffman decoder state machine) 100 according to embodiments of the present invention may be implemented in hardware such as: a field programmable gate array (FPGA) that includes processing components 110 and memory 120 (e.g., a lookup table); a microcontroller including a processor 110 and memory 120; an application specific integrated circuit (ASIC); or combinations thereof. Embodiments of the present invention that include a reprogrammable memory 120 can be reconfigured to decode different codebooks based on particular applications.

Aspects of embodiments of the present invention relate to a design of a decoding system a having a biased (or optimal) codebook. In a codebook according to aspects of embodiments of the present invention, the binary code symbols (e.g., "0" and "1") are biased such that one binary code symbol (e.g., "0") is generally used for shorter codes and the other binary code symbol (e.g. "1") is generally used for longer codes in the codebook. (In other embodiments of the present invention, the binary code symbol "0" may be used for longer codes and the binary code symbol "1" may be used for shorter codes.) This consistent bias enables a more compact hardware design (e.g., simplified and/or less computational hardware) according to some embodiments of the present invention.

According to one embodiment of the present invention, a codebook is considered "optimized" if, for any code of some symbol ending with "1", switching "1" to "0", the new code must be a valid code for another symbol in this codebook. For example, if "xxxx1" is a code for some symbol in the optimized codebook, then "xxxx0" must be a legitimate code for some other symbol in the code book. As used herein, the term "optimized" is intended to refer to the condition of a codebook that is biased as discussed above and the term "optimized" is not intended to mean that the codebook is incapable of further improvement. Instead, embodiments of the present invention may be further modified in various ways to further improve the codebook for use in the general case or under specific operating conditions.

Aspects of embodiments of the present invention are also directed to a method for modifying an existing codebook to optimize the codebook for use in hardware decoder according to some embodiments of the present invention.

By using a codebook that is biased as suggested above, aspects of embodiments of the present invention may be implemented using a common submodule (or common module) that keeps only the long code branches, thereby reducing the number of states used in the state machine. In other words, the decoder may be implemented using a common module that operates on all parts of the supplied code, where the common module has a simplified logic that operates based on the optimized codebook.

Figure 3:
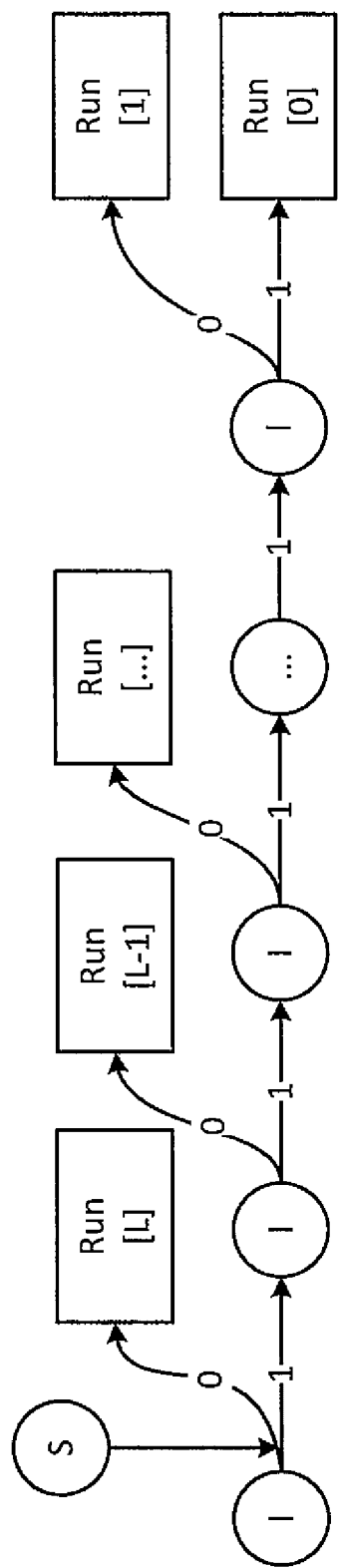
FIG. 3 is an abstract representation of a simplified state machine according to one embodiment of the present invention.

A variable length codebook that is optimized as described above can be implemented using a simplified state machine having reduced hardware complexity. FIG. 3 is an abstract representation of a simplified state machine according to one embodiment of the present invention. In the state machine illustrated in FIG. 3, transitions based on a read input binary code symbol of "1" lead to longer codes whereas transitions based on a read input binary code symbol of "0" lead to shorter codes (e.g., Run [L], Run [L-1], and Run [1] as shown in FIG. 3, where each of the branches on the "0" edge or transition is shorter than the branch along the "1" edge or transition). The state machine may be implemented using a simple processing loop that identifies transitions and operations based on identifying transitions from a lookup table stored in the memory 120.

Table 3 is a sample codebook and Table 4 is an "optimized" or "biased" version of the codebook shown in Table 3, where the optimized version in Table 4 exhibits the bias toward "0" for shorter codes and "1" for longer codes.

TABLE 3

| Symbol | Code |
|---|---|
| A | 11 |
| B | 10110 |
| C | 1010 |
| D | 10111 |
| E | 0 |
| F | 10010 |
| G | 10011 |
| H | 10001 |
| I | 100000 |
| J | 100001 |

TABLE 4

| Symbol | Code |
|---|---|
| A | 10 |
| B | 11010 |
| C | 1100 |
| D | 11011 |
| E | 0 |
| F | 11100 |
| G | 11101 |
| H | 11110 |
| I | 111110 |
| J | 111111 |

Figure 4:
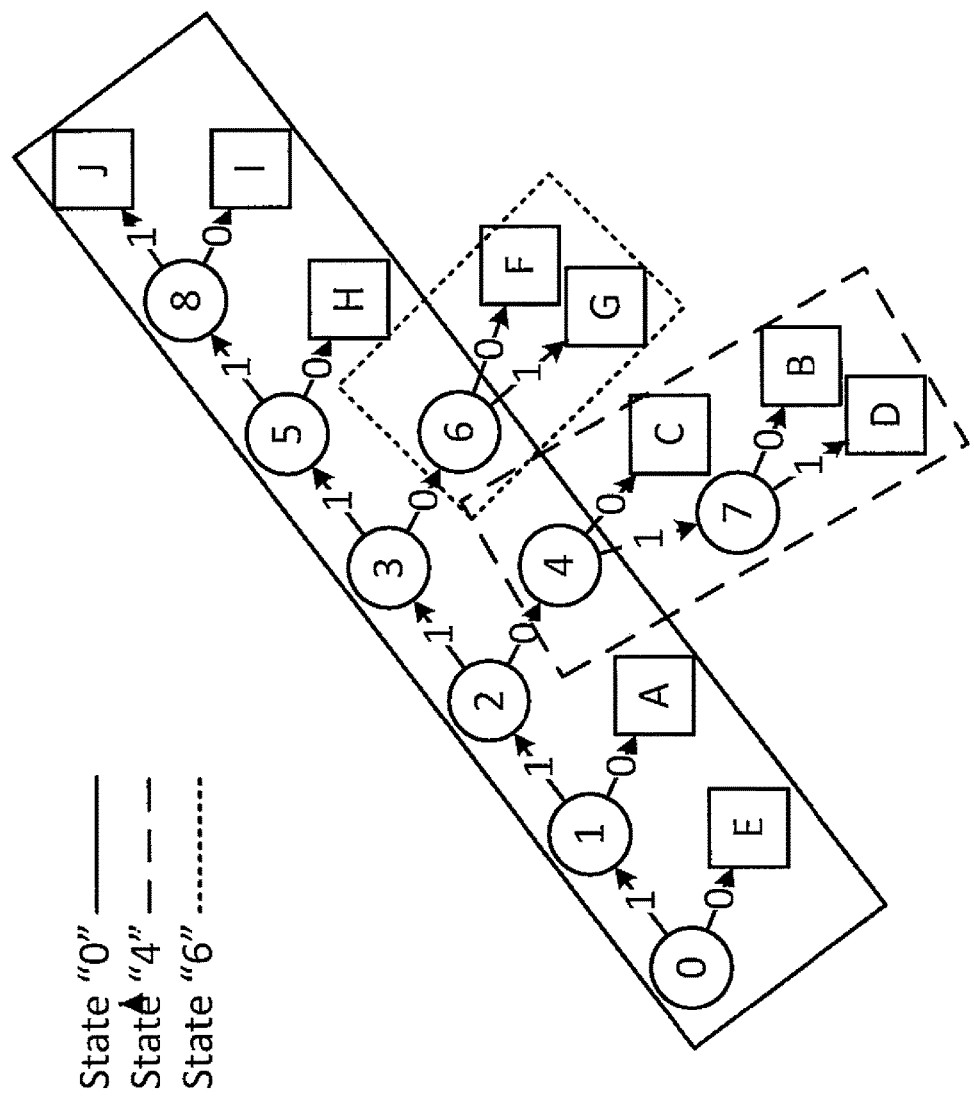
FIG. 4 is a diagram illustrating a state machine implementing a codebook according to one embodiment of the present invention.

FIG. 4 is a diagram illustrating a biased state machine implementing a biased version of the code according to one embodiment of the present invention. The state machine of FIG. 4 corresponds to the codebook shown in Table 4 above and has the general structure of the state machine shown in FIG. 3. The state machine in FIG. 4 differs from FIG. 1 in that some of the transitions have been swapped in order to create a "bias" where "0" generally refers to shorter codes (e.g., transitions along "0" edges lead to shorter branches) while "1" refers to longer codes (e.g., transitions along "1" edges lead to longer branches). The swapping of the codes also indicates that the optimized state machine utilizes different codes from the "unoptimized" or "unbiased" state machine (e.g., the machine shown in FIG. 1) as seen by comparing Tables 3 and 4 above.

Figure 5:
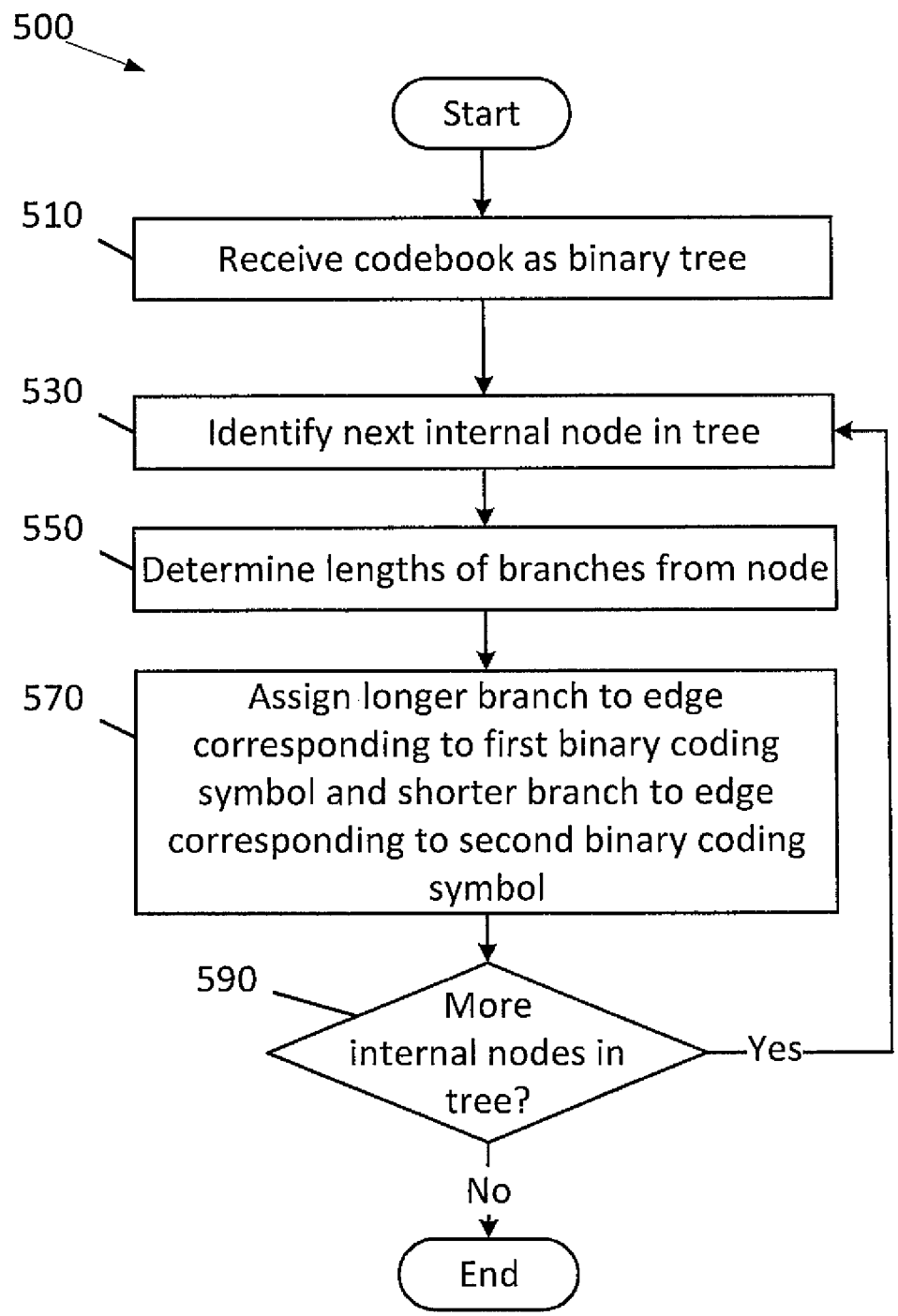
FIG. 5 is a flowchart illustrating a method for optimizing a codebook according to one embodiment of the present invention.

FIG. 5 is a flowchart illustrating a method 500 for modifying a state machine (and therefore a corresponding codebook) to generate a biased state machine (or biased codebook) according to one embodiment of the present invention. The method 500 may be performed by a computing device including a processor coupled to memory, where the state machine is stored in the memory and wherein the memory stores instructions that, when executed by the processor, cause the processor to perform operations of the method 500 on the state machine stored in the memory.

As discussed above, in a biased state machine, a first of the binary coding symbols (e.g., "1") is chosen to correspond to longer codes while the other binary coding symbol (e.g., "0") is chosen to correspond to shorter codes. Referring to FIG. 5, in operation 510 the method may receive a state machine as a binary tree (the state machine may be represented as, for example, a table). The state machine or codebook supplied to the method 500 may be generated using a standard technique for generating a Huffman code, as would be known by one of skill in the art. FIG. 1 is a graphical representation of one such state machine that may be modified by the method 500 according to one embodiment of the present invention.

In operation 530, a next internal node in the tree is selected to be analyzed. The method may identify nodes in substantially any order, in part because the technique maintains the general structure of the tree maintains invariants with respect to the lengths of branches (as discussed below). In some embodiments, the process begins with a root node (e.g., the initial or "0" state) and identifies later nodes proceeding from the root node in breadth-first or depth-first order. In other embodiments of the present invention, the process begins with internal nodes that are connected only to leaf nodes and works "up" the tree toward the root node.

In operation 550, the method determines the lengths of the branches from the current node. Each internal node has two outgoing edges that are connected to either another internal node or a leaf node and these edges are labeled with different ones of the binary code symbols (e.g., "0" and "1"). The subtrees connected these outgoing edges may be referred to as "branches" and a "branch length" L refers to the largest number of internal nodes along that branch between the current node and a leaf node. For example, in FIG. 1, state 1 includes a first branch (the "0" branch) connected to state 2 and a second branch (the "1" branch) connected to leaf node "A". The branch length L of the second branch is zero because there are no internal nodes between state 1 and the leaf node "A". The first branch has a branch length of four because the farthest leaf node or nodes (here, leaf nodes "I" and "J") is four internal nodes away (internal nodes 2, 3, 5, and 8 are between node 1 and leaf nodes "I" and "J"). Although other leaf nodes such as "B," "F," and "G" are also in this branch, these leaf nodes are only three nodes away and therefore are not considered in computing the branch length of the first branch of state 1 because they are not the most distant nodes.

In some embodiments of the present invention, dynamic programming or memorization techniques may be used to store previously computed branch lengths in order to avoid unnecessary computation of branches. In such embodiments, determining the branch lengths of the branches may also include looking up previously computed branch lengths.

In operation 570, the longer of the two branches is assigned to the edge associated with the first of the binary symbols (the binary symbol associated with longer codes, in this example "1") and the shorter of the two branches is assigned to the other edge. In some cases, the received codebook may already satisfy this property. If not, the branches are swapped, for example, by exchanging the binary code symbols associated with the branches (e.g., from "0" to "1" on one edge and from "1" to "0" on the other edge). In the case of equal branch lengths, no reassignment (or swapping) of the branches is necessary.

For example, comparing FIG. 1 and FIG. 4, in state 1, the branch to state 2 has a longer branch length than the branch to leaf state "A". Therefore, when supplied the state machine of FIG. 1, the branches "0" and "1" are swapped so that the "1" edge leads to internal state 2 and the "0" edge leads to leads state "A", as shown in FIG. 4.

Because the branches of the trees are merely swapped, the lengths of those branches remain the same after the swap. Furthermore, because both branches are connected to the same internal node, the branch length of the subtree including the current node remains the same. Therefore, as the method modifies the binary tree to generate the biased codebook, the overall branch length of any given branch remains the same. Due to this property, the nodes may be processed in any order.

In operation 590, the decoder 100 determines if there are more internal nodes to analyze. If so, then the decoder 100 proceeds to operation 530 in which a next internal node is selected. If there are no additional nodes to analyze, then the modification of the codebook is complete and the method 500 ends.

The "optimized" codebook shown in Table 4 allows the state machine to be encoded using a reduced lookup table. Table 5 is an example of a lookup table depicting the state transitions in an optimized code book (e.g., the codebook of Table 4) according to one embodiment of the present invention.

TABLE 5

| State (S) | I | L | O or Next S | I | L | O or Next S |
|---|---|---|---|---|---|---|
| 0 | 0 | 5, 4, 3, 2, 1, 0 | E, A, 4, 6, H, I | 1 | 0 | J |
| 4 | 0 | 1, 0 | C, B | 1 | 0 | D |
| 6 | 0 | 0 | F | 1 | 0 | G |

The lookup table for state transitions using an optimized codebook according to embodiments of the present invention identifies an output symbol (O) or a next state (next S) based on the current state S, the next input binary code symbol I, and the current branch length L. According to one embodiment of the present invention, an optimized codebook includes fewer states than a comparable codebook before optimization. In the example shown in Table 5, the nine states of the original codebook shown in Table 2 have been reduced to three states (states 0, 4, and 6). In corresponding FIG. 4, states 0, 4, and 6 are boxed using solid, dashed, and dotted lines, respectively. The three states 0, 4, and 6 may also be considered to be sub-codebooks or sub-tables of the system, in which the sub-tables map input binary code symbol I and branch length L to output symbols or states for their corresponding state S. As such, transitioning from one state to another may also be considered to be switching to a different codebook or different lookup table.

Figure 6:
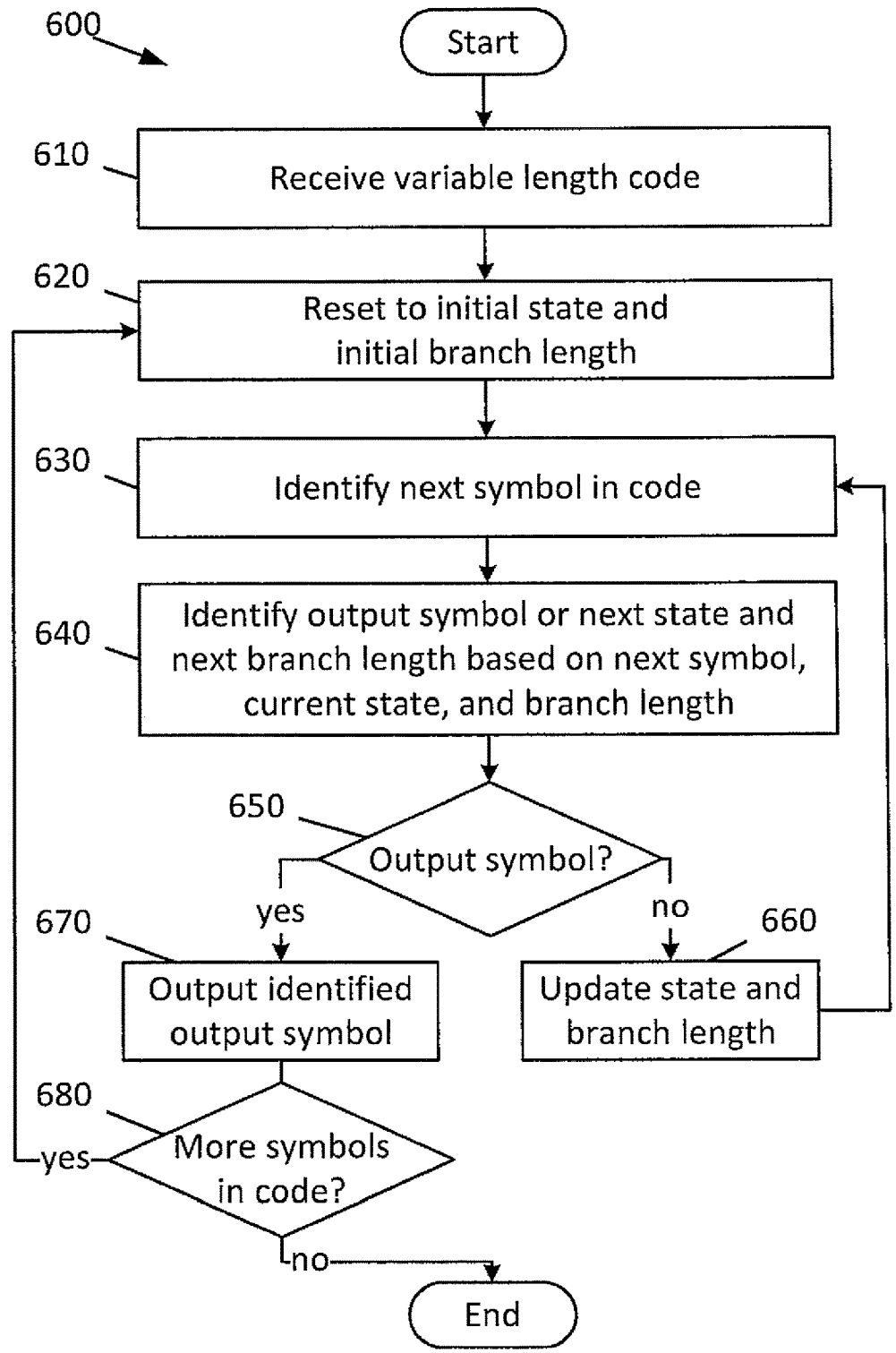
FIG. 6 is a flowchart illustrating a method for decoding a variable length coded input according to one embodiment of the present invention.

FIG. 6 is a flowchart illustrating a method 600 for decoding a variable length coded input 10 according to one embodiment of the present invention. In operation 610, the variable length decoding system 100 receives a variable length coded input 10 (e.g., an input received via a serial communication device). In operation 620, the state machine is reset by setting the state to the initial state (e.g., state 0) and initial branch length (e.g., the length of the longest branch in the codebook). In operation 630, the next symbol in the received variable length coded input 10 is identified (the symbols are generally taken from the received message one symbol at a time). In operation 640, a next state is identified based on the current branch length, the current state, and the identified symbol of the variable length coded input 10. By finding an entry in the lookup table matching the current state, current branch length, and current input symbol, the variable length decoding system 100 identifies a next state and next branch length in operation 640.

For example, referring to Table 5 (above) and FIG. 4, initially, current state S is set to 0 and current branch length L is set to 5, which is the length of the branch along the "1" edge. If a "0" is read as the input I, then consulting the row for state 0 in Table 5 and a branch length of 5 maps to the output symbol "E". Alternatively, if a "1" is read, then there is no matching condition in the table, so no state transition is needed, and the decoder 100 decrements L to signify moving to "state 1" of the FIG. 4 and proceeds with identifying the next input symbol of the variable length coded input 10. As another example, if S is 0 and L is 3, then the system is implicitly at "state 2" as shown in FIG. 4. In this case, if I is "0", then the lookup operation identifies the Next S to be 4, as seen in Table 5 above.

In operation 650, the decoder 100 determines if the result of lookup operation 640 was an output symbol. If not, then the branch length and/or state are updated in operation 660 (e.g., L may be decreased or decremented and S may be updated as necessary in accordance with the lookup table, as described above) and the decoder returns to operation 630 to identify the next symbol in the variable length coded input 10.

If the result of the lookup operation is an output symbol, then that output symbol is output from the decoder 100 in operation 670 as part of output symbols 20. In operation 680, the decoder 100 determines whether there are more symbols to process in the received variable length coded input 10. If so, then the decoder 100 returns to operation 620 to reset the decoder 100 to its initial state S and initial branch length L and to proceed with decoding the variable length coded input 10. If there are no more symbols in the variable length coded input 10, then the decoder 100 ends the decoding process.

In some embodiments of the present invention, similar output states can be grouped if the output symbols can be partially described by the codebook. In such embodiments, the output groups of symbols of a portion of the tree are expressed as a formula rather than enumerating the output symbols one by one. In some circumstances, such as when the descriptive formula is simple enough, then the descriptive formula may require fewer gates of the processing hardware than an enumeration of the states and therefore the hardware cost can be further reduced.

For example, in the embodiment shown in Table 5 above, when in state 4, there are three possible output symbols: B, C, and D. Which of these symbols is eventually output is determined by the next binary code symbol I and the branch length (L) or the pair (I,L). From state 4, the pair (I,L) may take on three possible values: (0,0), (0,1), and (1,0) for output symbols "B", "C", and "D", respectively. In more detail, at state 4, the branch length L is 1 because there is still another non-leaf state (state 7) in the current branch and when I is "0", then the transition to the output node C is taken. Therefore, "C" is represented by the pair (I,L) pair (0,1). Similarly, when L is 0, then the state machine is, implicitly, in state 7 of FIG. 4 because there are no more non-leaf states in the branch. From state 7, if I is "0", then the output symbol is "B" and if I is "1", then the output symbol is "D". Accordingly, "B" may be represented as (0,0) and "D" may be represented as (1,0).

Therefore, the output states from state 4 can be expressed (or formulated) as the associated formula B+L+(I*2), assuming the symbols C=B+1 and D=B+2. Similarly, state 6 may be associated with the formula (or formulated as) F+I, assuming G=F+1.

These formulated representations of the states (or formulas) may be encoded directly by the decoder 100, thereby requiring fewer gates to implement the decoding because fewer table entries are stored than in an unoptimized codebook.

Figure 7:
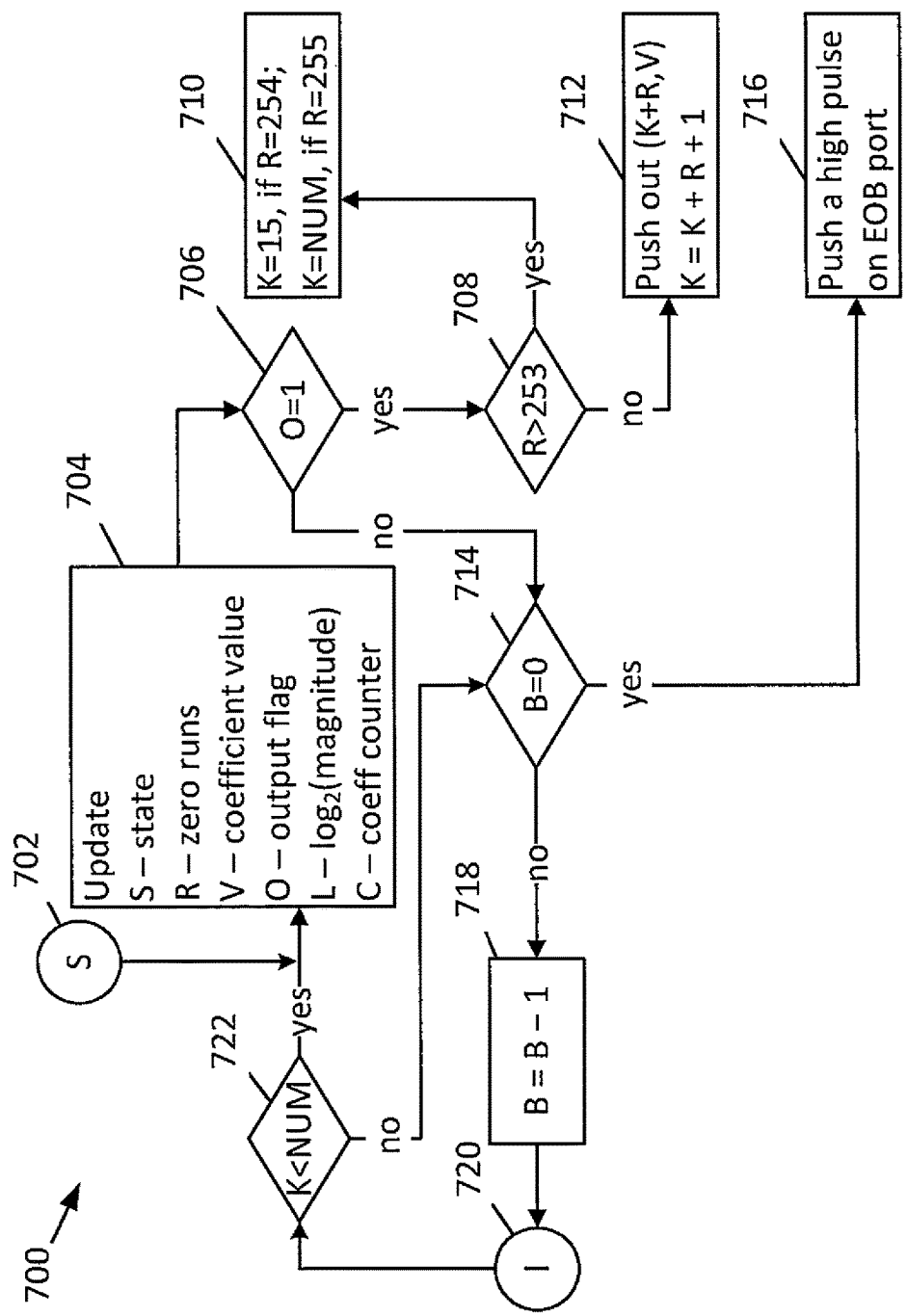
FIG. 7 is a flowchart illustrating a method for decoding a variable length coded input according to one embodiment of the present invention.

FIG. 7 is a flowchart illustrating a method 700 for decoding a variable length code for a fixed block data size according to one embodiment of the present invention in association with the codebook shown in Appendix A and where the state transitions according to one embodiment are shown in Appendix B. In this example codec, the output symbols are pairs of zero-runs (the number of zero coefficients before the current non-zero value) and magnitude (the number of bits for the non-zero coefficients). This allows the compression of NUM coefficients into a fixed size number BSZ of bits.

A decoder 100 begins by initializing the state machine in operation 702, by setting initial state S=0; setting initial state L=8; initial setting for DC K=0; initial coefficient index B=BSZ−1; and coded block sizeB, where K is the index, BSZ is the block size, and B is a bit counter to count the remaining bits for the block.

In operation 704, the various tracking variables are updated, where S—state, R—zero runs, V—coefficient value, O—output flag, L—$\log_2$ (magnitude), and C—coefficient counter. In operation 706, the decoder 100 determines whether the output flag O is set. If so, then, in operation 708, the decoder 100 determines whether the zero runs exceed 253. If so, then, in operation 710, K is set to 15 if R is 254 and K set to NUM if R is 255. If R does not exceed 253, then the output symbol (K+R,V) is pushed out in operation 712 and K is set to K+R+1.

If the output flag O is not set, then in operation 714 the decoder 100 determines whether B is 0 (e.g., whether all the bits in the block have been read). If so, then the decoder 100 pushes a high pulse on the end of block (EOB) port in operation 716, where the end of block signal is used to indicate that decoding is done for the current block. If not, then in operation 718, the decoder 100 decrements B and then reads the next input in operation 720. In operation 722, the decoder 100 determines whether K is less than NUM, where NUM is the total number of coefficients. If not, then the decoder 100 returns to operation 716 to pad bits to the output until B reaches 0. If K is not less than NUM, then the decoder returns to operation 704 to update the state machine and proceed with another cycle.

The decoder and/or any other relevant devices or components according to embodiments of the present invention described herein may be implemented utilizing any suitable hardware, firmware (e.g. an application-specific integrated circuit), software, or a suitable combination of software, firmware, and hardware. For example, the various components of the decoder 100 may be formed on one integrated circuit (IC) chip or on separate IC chips. Further, the various components of the decoder 100 may be implemented on a flexible printed circuit film, a tape carrier package (TCP), a printed circuit board (PCB), or formed on a same substrate as the decoder 100. Further, the various components of the decoder may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the scope of the exemplary embodiments of the present invention.

While the present invention has been described in connection with certain example embodiments, it is to be understood that the invention is not limited to the disclosed embodiments, but, on the contrary, is intended to cover various modifications and equivalent arrangements included within the spirit and scope of the appended claims, and equivalents thereof.

APPENDIX A—EXAMPLE HUFFMAN TABLES

TABLE A1

| Low Frequency Coefficients (1-14) | | | |
| --- | --- | --- | --- |
| Run | Mag | bits | code |
| 0 | 1 | 2 | 00 |
| 0 | 2 | 2 | 01 |
| 0 | 0 | 3 | 110 |
| 0 | 3 | 3 | 100 |
| 0 | 4 | 3 | 101 |
| 0 | 5 | 4 | 1110 |
| 1 | 1 | 6 | 111100 |
| 1 | 0 | 7 | 1111010 |
| 1 | 2 | 7 | 1111011 |
| 0 | 6 | 7 | 1111100 |
| 0 | 7 | 7 | 1111101 |
| EOB | | 7 | 1111111 |
| 1 | 3 | 9 | 111111000 |
| 1 | 4 | 10 | 1111110010 |
| 1 | 5+ | 10 | 1111110011 |
| 2 | 1 | 10 | 1111110100 |
| 2 | 0 | 11 | 11111101010 |
| 2 | 2 | 11 | 11111101011 |
| 0 | 8 | 11 | 11111101100 |
| 2 | 3 | 12 | 111111011010 |
| 2 | 4 | 12 | 111111011011 |
| 2 | 5+ | 12 | 111111011100 |

TABLE A1-continued

Low Frequency Coefficients (1-14)

| | | | |
|---|---|---|---|
| 3 | 0+ | 12 | 111111011101 |
| 4 | 0+ | 12 | 111111011110 |
| 5+ | 0+ | 12 | 111111011111 |

| Extra run 5+ | R5+ bits | | |
|---|---|---|---|
| 5 | +2 | 10 | |
| 6, 7 | +3 | 11x | |
| 8, . . . , 15 | +4 | 0xxx | |

| Extra mag | M0+ bits | | |
|---|---|---|---|
| 0 | +1 | 0 | |
| 1 | +2 | 10 | |
| 2 | +3 | 110 | |
| 3 | +5 | 11100 | |
| 4 | +5 | 11101 | |
| 5+ | +4 | 1111 | |

| Extra mag 5+ | M5+ bits | | |
|---|---|---|---|
| 5 | +2 | 00 | |
| 6 | +2 | 01 | |
| 7 | +2 | 10 | |
| 8 | +2 | 11 | |

TABLE A2

High Frequency Coefficients (>14)

| Run | Mag | new bits | code |
|---|---|---|---|
| 0 | 0 | 1 | 0 |
| 0 | 1 | 2 | 10 |
| 1 | 0 | 3 | 110 |
| 2 | 0 | 5 | 11100 |
| 1 | 1 | 5 | 11101 |
| 3 | 0 | 6 | 111100 |
| 0 | 2 | 6 | 111101 |
| 2 | 1 | 6 | 111110 |
| 4 | 0 | 8 | 11111100 |
| 1 | 2 | 9 | 111111010 |
| 3 | 1 | 9 | 111111011 |
| 2 | 2 | 9 | 111111101 |
| EOB | | 9 | 111111111 |
| 5+ | 0+ | 9 | 111111110 |
| 4 | 1 | 10 | 1111111000 |
| 0 | 3 | 11 | 11111110010 |
| 3 | 2 | 13 | 1111111001100 |
| 1 | 3+ | 13 | 1111111001101 |
| 0 | 4 | 14 | 11111110011100 |
| 0 | 5 | 15 | 111111100111010 |
| 0 | 6 | 15 | 111111100111011 |
| 4 | 2 | 15 | 111111100111100 |
| 2 | 3+ | 15 | 111111100111101 |
| 3 | 3+ | 15 | 111111100111110 |
| 4 | 3+ | 15 | 111111100111111 |

TABLE A2-continued

High Frequency Coefficients (>14)

| Extra run 5+ | R5+ bits | | |
|---|---|---|---|
| 5 | 2 | 00 | |
| 6, 7 | 3 | 01x | |
| 8, . . . 15 | 6 | 100xxx | |
| 16, . . . 31 | 7 | 101xxxx | |
| 32, . . . 63 | 8 | 110xxxxx | |
| 64, . . . 127 | 10 | 1110xxxxxx | |
| 128, . . . 255 | 11 | 1111xxxxxxx | |

| Extra mag | M0+ bits | | |
|---|---|---|---|
| 0 | 1 | 0 | |
| 1 | 2 | 10 | |
| 2 | 3 | 110 | |
| 3+ | 3 | 111 | |

| Extra mag 3+ | M3+ bits | | |
|---|---|---|---|
| 3 | 1 | 0 | |
| 4 | 2 | 10 | |
| 5 | 3 | 110 | |
| 6 | 3 | 111 | |

APPENDIX B—EXAMPLE STATE TRANSITION TABLES

Unpack DC coefficient

| Input Data | | Output Data | | | | | |
|---|---|---|---|---|---|---|---|
| S | I | R | L | V | S | O | C |
| +0 | 0 | 0 | — | L-1 | = | 1 if L = 0 | 0 | — |
| +1 | 0 | 1 | = | L-1 | $V + 2^L$ | 0 else | 0 | — |
| +0 | 1 | 0 | = | — | = | 100 | 1 | 14 |
| +1 | 1 | 1 | = | — | -V | | | |

State transitions for remaining coefficients

| Input Data | Output Data | | | | | | |
|---|---|---|---|---|---|---|---|
| S | I | R | L | V | S | O | C |
| 0 | 100 | 0 | — | — | 101 | 0 | = |
| 1 | 100 | 1 | — | — | 102 | 0 | = |
| 00 | 101 | 0 | 0 | 0-Q | 2 | 198/199 | 0 | C-1 |
| 01 | 101 | 1 | 0 | 1-Q | 4 | 198/199 | 0 | C-1 |
| 10 | 102 | 0 | — | — | 103 | 0 | = |
| 11 | 102 | 1 | — | — | 104 | 0 | = |
| 100 | 103 | 0 | 0 | 2-Q | 8 | 198/199 | 0 | C-1 |
| 101 | 103 | 1 | 0 | 3-Q | 16 | 198/199 | 0 | C-1 |
| 110 | 104 | 0 | 0 | — | 1 | 199 | 0 | C-1 |
| 111 | 104 | 1 | — | — | 105 | 0 | = |
| 1110 | 105 | 0 | 0 | 4-Q | 32 | 198 | 0 | C-1 |
| 1111 | 105 | 1 | — | — | 106 | 0 | = |
| 11110 | 106 | 0 | — | — | 107 | 0 | = |
| 11111 | 106 | 1 | — | — | 109 | 0 | = |

-continued

| State transitions for remaining coefficients | | | | | | | |
|---|---|---|---|---|---|---|---|
| Input Data | | | | | Output Data | | |
| S | I | R | L | V | S | O | C |
| 111100 | 107 | 0 | 1 | 0-Q | 2 | 198/199 | 0 | C-2 |
| 111101 | 107 | 1 | — | — | — | 108 | 0 | = |
| 1111010 | 108 | 0 | 1 | — | 1 | 199 | 0 | C-2 |
| 1111011 | 108 | 1 | 1 | 1-Q | 4 | 198/199 | 0 | C-2 |
| 111110 | 109 | 0 | — | — | — | 110 | 0 | = |
| 111111 | 109 | 1 | — | — | — | 111 | 0 | = |
| 1111100 | 110 | 0 | 0 | 5-Q | 64 | 198 | 0 | C-1 |
| 1111101 | 110 | 1 | 0 | 6-Q | 128 | 198 | 0 | C-1 |
| 1111110 | 111 | 0 | — | — | — | 112 | 0 | = |
| 1111111 | 111 | 1 | 254 | 0 | — | 200 | 1 | 225 |
| 11111100 | 112 | 0 | — | — | — | 113 | 0 | = |
| 11111101 | 112 | 1 | — | — | — | 115 | 0 | = |
| 111111000 | 113 | 0 | 1 | 2-Q | 8 | 198/199 | 0 | C-2 |
| 111111001 | 113 | 1 | — | — | — | 114 | 0 | = |
| 1111110010 | 114 | 0 | 1 | 3-Q | 16 | 198/199 | 0 | C-2 |
| 1111110011 | 114 | 1 | 1 | — | — | 150 | 0 | C-2 |
| 111111010 | 115 | 0 | — | — | — | 116 | 0 | = |
| 111111011 | 115 | 1 | — | — | — | 118 | 0 | = |
| 1111110100 | 116 | 0 | 2 | 0-Q | 2 | 198/199 | 0 | C-3 |
| 1111110101 | 116 | 1 | — | — | — | 117 | 0 | = |
| 11111101010 | 117 | 0 | 2 | — | 1 | 199 | 0 | C-3 |
| 11111101011 | 117 | 1 | 2 | 1-Q | 4 | 198/199 | 0 | C-3 |
| 1111110110 | 118 | 0 | — | — | — | 119 | 0 | = |
| 1111110111 | 118 | 1 | — | — | — | 121 | 0 | = |
| 11111101100 | 119 | 0 | 0 | 7-Q | 256 | 198 | 0 | C-1 |
| 11111101101 | 119 | 1 | — | — | — | 120 | 0 | = |
| 111111011010 | 120 | 0 | 2 | 2-Q | 8 | 198/199 | 0 | C-3 |
| 111111011011 | 120 | 1 | 2 | 3-Q | 16 | 198/199 | 0 | C-3 |
| 11111101110 | 121 | 0 | — | — | — | 122 | 0 | = |
| 11111101111 | 121 | 1 | — | — | — | 123 | 0 | = |
| 111111011100 | 122 | 0 | 2 | — | — | 150 | 0 | C-3 |
| 111111011101 | 122 | 1 | 3 | — | — | 140 | 0 | C-4 |
| 111111011110 | 123 | 0 | 4 | — | — | 140 | 0 | C-5 |
| 111111011111 | 123 | 1 | — | — | — | 124 | 0 | = |
| 1111110111110 | 124 | 0 | 8 | — | 2 | 130 | 0 | = |
| 1111110111111 | 124 | 1 | — | — | — | 125 | 0 | = |
| 11111101111100 | 125 | 0 | 5 | — | — | 140 | 0 | C-6 |
| 11111101111101 | 125 | 1 | 6 | — | 0 | 130 | 0 | = |
| +0 | 130 | 0 | = | — | V-1 | if V = 0: 140 | 0 | C-R-1 |
| +1 | 130 | 1 | R + $2^V$ | — | V-1 | else: 130 | 0 | = |
| +0 | 140 | 0 | = | — | 1 | 199 | 0 | = |
| +1 | 140 | 1 | = | — | — | 141 | 0 | = |
| +10 | 141 | 0 | = | 0-Q | 2 | 198/199 | 0 | = |
| +11 | 141 | 1 | = | — | — | 142 | 0 | = |
| +110 | 142 | 0 | = | 1-Q | 4 | 198/199 | 0 | = |
| +111 | 142 | 1 | = | — | — | 143 | 0 | = |
| +1110 | 143 | 0 | = | — | — | 144 | 0 | = |
| +1111 | 143 | 1 | = | — | — | 150 | 0 | = |
| +11100 | 144 | 0 | = | 2-Q | 8 | 198/199 | 0 | = |
| +11101 | 144 | 1 | = | 3-Q | 16 | 198/199 | 0 | = |
| +0 | 150 | 0 | = | — | — | 151 | 0 | = |
| +1 | 150 | 1 | = | — | — | 152 | 0 | = |
| +00 | 151 | 0 | = | 4-Q | 32 | 198 | 0 | = |
| +01 | 151 | 1 | = | 5-Q | 64 | 198 | 0 | = |
| +10 | 152 | 0 | = | 6-Q | 128 | 198 | 0 | = |
| +11 | 152 | 1 | = | 7-Q | 256 | 198 | 0 | = |
| +0 | 198 | 0 | = | L-1 | — | if L = 0: 199 | 0 | = |
| +1 | 198 | 1 | = | L-1 | V + $2^{L+Q}$ | else: 198 | 0 | = |
| +0 | 199 | 0 | = | — | = | if C = 0: 200 | 1 | 225 |
| +1 | 199 | 1 | = | — | -V | else: 100 | 1 | = |
| 0 | 200 | 0 | 0 | — | 1 | 299 | 0 | C-1 |
| 1 | 200 | 1 | — | — | — | 201 | 0 | = |
| 10 | 201 | 0 | 0 | 0-Q | 2 | 298/299 | 0 | C-1 |
| 11 | 201 | 1 | — | — | — | 202 | 0 | = |
| 110 | 202 | 0 | 1 | — | 1 | 299 | 0 | C-2 |
| 111 | 202 | 1 | — | — | — | 203 | 0 | = |
| 1110 | 203 | 0 | — | — | — | 204 | 0 | = |
| 1111 | 203 | 1 | — | — | — | 205 | 0 | = |
| 11100 | 204 | 0 | 2 | — | 1 | 299 | 0 | C-3 |
| 11101 | 204 | 1 | 1 | 0-Q | 2 | 298/299 | 0 | C-2 |
| 11110 | 205 | 0 | — | — | — | 206 | 0 | = |
| 11111 | 205 | 1 | — | — | — | 207 | 0 | = |
| 111100 | 206 | 0 | 3 | — | 1 | 299 | 0 | C-4 |

-continued

| State transitions for remaining coefficients | | | | | | | |
|---|---|---|---|---|---|---|---|
| Input Data | | Output Data | | | | | |
| S | I | R | L | V | S | O | C |
| 111101 | 206 | 1 | 0 | 1-Q | 4 | 298/299 | 0 | C-1 |
| 111110 | 207 | 0 | 2 | 0-Q | 2 | 298/299 | 0 | C-3 |
| 111111 | 207 | 1 | — | — | — | 208 | 0 | = |
| 1111110 | 208 | 0 | — | — | — | 209 | 0 | = |
| 1111111 | 208 | 1 | — | — | — | 211 | 0 | = |
| 11111100 | 209 | 0 | 4 | — | 1 | 299 | 0 | C-5 |
| 11111101 | 209 | 1 | — | — | — | 210 | 0 | = |
| 111111010 | 210 | 0 | 1 | 1-Q | 4 | 298/299 | 0 | C-2 |
| 111111011 | 210 | 1 | 3 | 0-Q | 2 | 298/299 | 1 | C-4 |
| 11111110 | 211 | 0 | — | — | — | 212 | 0 | = |
| 11111111 | 211 | 1 | — | — | — | 213 | 0 | = |
| 111111100 | 212 | 0 | — | — | — | 214 | 0 | = |
| 111111101 | 212 | 1 | 2 | 1-Q | 4 | 298/299 | 0 | C-3 |
| 111111110 | 213 | 0 | — | — | — | 224 | 0 | = |
| 111111111 | 213 | 1 | 255 | 8 | — | 0 | 1 | — |
| 1111111000 | 214 | 0 | 4 | 0-Q | 2 | 298/299 | 0 | C-5 |
| 1111111001 | 214 | 1 | — | — | — | 215 | 0 | = |
| 11111110010 | 215 | 0 | 0 | 2-Q | 8 | 298/299 | 0 | C-1 |
| 11111110011 | 215 | 1 | — | — | — | 216 | 0 | = |
| 111111100110 | 216 | 0 | — | — | — | 217 | 0 | = |
| 111111100111 | 216 | 1 | — | — | — | 218 | 0 | = |
| 1111111001100 | 217 | 0 | 3 | 1-Q | 4 | 298/299 | 0 | C-4 |
| 1111111001101 | 217 | 1 | 1 | — | — | 250 | 0 | = |
| 1111111001110 | 218 | 0 | — | — | — | 219 | 0 | = |
| 1111111001111 | 218 | 1 | — | — | — | 221 | 0 | = |
| 11111110011100 | 219 | 0 | 0 | 3-Q | 16 | 298/299 | 0 | C-1 |
| 11.111110011101 | 219 | 1 | — | — | — | 220 | 0 | = |
| 111111100111010 | 220 | 0 | 0 | 4-Q | 32 | 298/299 | 0 | C-1 |
| 111111100111011 | 220 | 1 | 0 | 5-Q | 64 | 298/299 | 0 | C-1 |
| 11111110011110 | 221 | 0 | — | — | — | 222 | 0 | = |
| 11111110011111 | 221 | 1 | — | — | — | 223 | 0 | = |
| 111111100111100 | 222 | 0 | 4 | 1-Q | 4 | 298/299 | 0 | C-5 |
| 111111100111101 | 222 | 1 | 2 | — | — | 250 | 0 | C-3 |
| 111111100111110 | 223 | 0 | 3 | — | — | 250 | 0 | C-4 |
| 111111100111111 | 223 | 1 | 4 | — | — | 250 | 0 | C-5 |
| 1111111100 | 224 | 0 | — | — | — | 225 | 0 | = |
| 1111111101 | 224 | 1 | — | — | — | 226 | 0 | = |
| 11111111000 | 225 | 0 | 5 | — | — | 240 | 0 | C-6 |
| 11111111001 | 225 | 1 | 6 | — | 0 | 230 | 0 | = |
| 11111111010 | 226 | 0 | — | — | — | 227 | 0 | = |
| 11111111011 | 226 | 1 | — | — | — | 228 | 0 | = |
| 111111110100 | 227 | 0 | 8 | — | 2 | 230 | 0 | = |
| 111111110101 | 227 | 1 | 16 | — | 3 | 230 | 0 | = |
| 111111110110 | 228 | 0 | 32 | — | 4 | 230 | 0 | = |
| 111111110111 | 228 | 1 | — | — | — | 229 | 0 | = |
| 1111111101110 | 229 | 0 | 64 | — | 5 | 230 | 0 | = |
| 1111111101111 | 229 | 1 | 128 | — | 6 | 230 | 0 | = |
| +0 | 230 | 0 | = | — | V-1 | if V = 0: 240 | 0 | C-R-1 |
| +1 | 230 | 1 | R + $2^V$ | — | V-1 | else: 230 | 0 | = |
| +0 | 240 | 0 | = | 1 | 1 | 299 | 0 | = |
| +1 | 240 | 1 | = | — | — | 241 | 0 | = |
| +10 | 241 | 0 | = | 0-Q | 2 | 298/299 | 0 | = |
| +11 | 241 | 1 | = | — | — | 242 | 0 | = |
| +110 | 242 | 0 | = | 1-Q | 4 | 298/299 | 0 | = |
| +111 | 242 | 1 | = | — | — | 250 | 0 | = |
| +0 | 250 | 0 | = | 2-Q | 8 | 298/299 | 0 | = |
| +1 | 250 | 1 | = | — | — | 251 | 0 | = |
| +10 | 251 | 0 | = | 3-Q | 16 | 298/299 | 0 | = |
| +11 | 251 | 1 | = | — | — | 252 | 0 | = |
| +110 | 252 | 0 | = | 4-Q | 32 | 298/299 | 0 | = |
| +111 | 252 | 1 | = | 5-Q | 64 | 298/299 | 0 | = |
| +0 | 298 | 0 | = | L-1 | — | if L = 0: 299 | 0 | = |
| +1 | 298 | 1 | = | L-1 | V + $2^{L+Q}$ | else: 298 | 0 | = |
| +0 | 299 | 0 | = | 8 | = | if C = 0: 0 | 1 | = |
| +1 | 299 | 1 | = | — | -V | else: 200 | 1 | = |

In the state 198/199 or 298/299, the state 198 or 298 is selected if and only if L≥0.

"-" indicates that any value can be assigned, and "=" indicates the value must preserved with no change.

All values used as formulas in the table are values before it is modified within this state, so no sequential correlation is assumed.

Note that, there are some general relations among the variables:

$V=2^M+\text{remainders.}=2^{L+Q+1}+\text{remainders.}$ $C=C-R-1.$

What is claimed is:

1. A method for decompressing video data from a graphical processing unit into a plurality of output symbols for a display panel of a mobile phone, the data comprising a variable length coded input comprising a plurality of binary code symbols, the method comprising:

setting, by a decoder comprising a processor and memory storing a lookup table comprising a plurality of states, a current state to an initial state and a current branch length to an initial branch length;

receiving, by the decoder, the variable length coded input comprising video data from the graphical processing unit;

identifying, by the decoder using the lookup table, a next state or a symbol of the output symbols based on a current state, a current branch length, and a next binary code symbol of the variable length coded input, wherein the identifying the next state or the symbol comprises:

identifying a matching entry in the lookup table representing a optimized codebook, the optimized codebook mapping a plurality of sequences of binary code symbols to a plurality of output symbols, the binary code symbols comprising a first code symbol and a second code symbol, when the next state is identified,
updating, by the decoder, the current state to the next state;
updating, by the decoder, the current branch length;
updating, by the decoder, the next binary code symbol of the variable length coded input; and
repeating, by the decoder, the identifying the next state or the symbol of the output symbols based on the updated current state, the updated current branch length, and the updated next binary code symbol of the variable length coded input; and when the symbol of the output symbols is identified,
outputting, from the decoder, the symbol of the output symbols to the display panel of the mobile phone for display of the video data.

2. The method of claim 1,
wherein the optimized codebook has a binary tree representation comprising a plurality of branches, the branches comprising a plurality of internal nodes, a plurality of leaf nodes, and a plurality of edges between the nodes, each edge being associated with one of the first code symbol and the second code symbol,
wherein each of the internal nodes is associated with a first edge associated with the first code symbol and connected to a first branch and a second edge associated with the second code symbol and connected to a second branch, and
wherein a branch length of the first branch is longer than a branch length of second branch.

3. The method of claim 1, wherein the identifying the next state or the symbol comprises:
identifying a formula corresponding to the current state; and
identifying the symbol of the output symbols based on the formula corresponding to the current state, the current branch length, and the next binary code symbol.

4. The method of claim 1, wherein the processor implements a common module used for each of the plurality of states.

5. The method of claim 1, wherein the variable length coded input is run-length encoded data and wherein the output symbols are pairs of zero runs and magnitude.

6. The method of claim 1, further comprising receiving the variable length coded input from a serial link.

7. The method of claim 1, wherein the lookup table comprises a plurality of lookup tables mapping branch length and binary coded symbol to the next state or the symbol of the output symbols, each of the lookup tables corresponding to a different state of the plurality of states.

* * * * *